US008436252B2

(12) United States Patent
Kawano et al.

(10) Patent No.: US 8,436,252 B2
(45) Date of Patent: May 7, 2013

(54) PRINTED WIRING BOARD AND METHOD FOR MANUFACTURING THE SAME

(75) Inventors: Shuichi Kawano, Ogaki (JP); Koichi Tsunoda, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 191 days.

(21) Appl. No.: 12/817,685

(22) Filed: Jun. 17, 2010

(65) Prior Publication Data

US 2010/0326709 A1 Dec. 30, 2010

Related U.S. Application Data

(60) Provisional application No. 61/221,751, filed on Jun. 30, 2009.

(51) Int. Cl.
*H05K 1/09* (2006.01)
*H05K 3/10* (2006.01)

(52) U.S. Cl.
USPC ........... 174/257; 174/250; 174/254; 257/751; 257/762; 257/774; 438/459; 438/629; 438/632

(58) Field of Classification Search .......... 174/252–267; 257/751, 700, 758, 761, 762, 774, 750, 737, 257/780–786, 920, 208, 211; 438/613–629, 438/638, 639, 106–118, 128; 29/825–852
See application file for complete search history.

(56) References Cited

U.S. PATENT DOCUMENTS

| | | | | |
|---|---|---|---|---|
| 5,933,753 | A * | 8/1999 | Simon et al. | 438/629 |
| 6,485,618 | B2 * | 11/2002 | Gopalraja et al. | 204/192.17 |
| 6,548,905 | B2 * | 4/2003 | Park et al. | 257/762 |
| 6,696,360 | B2 * | 2/2004 | Ahn et al. | 438/632 |
| 7,049,208 | B2 * | 5/2006 | Muthukumar et al. | 438/459 |
| 7,170,175 | B2 * | 1/2007 | Yamagata | 257/758 |
| 7,515,736 | B2 * | 4/2009 | Retterath et al. | 382/103 |
| 8,035,033 | B2 * | 10/2011 | Kobayashi | 174/250 |
| 8,119,918 | B2 * | 2/2012 | Sato et al. | 174/254 |
| 2006/0202346 | A1 * | 9/2006 | Shih et al. | 257/774 |
| 2008/0237860 | A1 * | 10/2008 | Ishizaka et al. | 257/751 |

FOREIGN PATENT DOCUMENTS

| | | |
|---|---|---|
| JP | 2-123756 | 5/1990 |
| JP | 08-107148 | 4/1996 |
| JP | 9-97795 | 4/1997 |
| JP | 10-200268 | 7/1998 |
| JP | 2000-13016 | 1/2000 |
| JP | 2001-144446 | 5/2001 |
| JP | 2001-168535 | 6/2001 |
| JP | 2001-196746 | 7/2001 |

(Continued)

*Primary Examiner* — Michail V Datskovskiy
(74) *Attorney, Agent, or Firm* — Oblon, Spivak, McClelland, Maier & Neustadt, L.L.P.

(57) ABSTRACT

A printed wiring board includes a first insulation layer, a first conductive circuit formed on the first insulation layer, a second insulation layer formed on the first insulation layer and the first conductive circuit and having an opening portion reaching the first conductive circuit, a second conductive circuit formed on the second insulation layer, and a via conductor formed in the opening portion and connecting the first conductive circuit and the second conductive circuit. The via conductor is formed an inner-wall surface of the opening portion and has a seed layer including a nitride compound and/or a carbide compound containing Ti, Zr, Hf, V, Nb, Ta or Si and a plated-metal film formed in the opening portion, and the plated-metal film and the first conductive circuit have at least portions making direct contact.

29 Claims, 9 Drawing Sheets

A

B

C

FOREIGN PATENT DOCUMENTS

| | | |
|---|---|---|
| JP | 2001-308478 | 11/2001 |
| JP | 2008-135728 | 6/2008 |
| JP | 2008-205070 | 9/2008 |

* cited by examiner

A

B

C

A
18
11
B
29
18
11
C
19
29
11
D
19
11
20
E
19
21
11
21
20
F
14
11
14
20
G
300
14
111
11
111
14
20

A
16
300
14a
111
14
11
B
32
16
300
111
14
11
C
150
32
16
300
111
14
11
D
150
32
16
300
14a
111
14
11
E
32
16
300
14a
111
14
11
F
160
32
16
300
14a
111
14
11
G
17
33
123
114
122
16
32
14a
111
14
300
11

PRINTED WIRING BOARD AND METHOD FOR MANUFACTURING THE SAME

CROSS-REFERENCE TO RELATED APPLICATIONS

The present application claims the benefits of priority to U.S. Application No. 61/221,751, filed Jun. 30, 2009. The contents of that application are incorporated herein by reference in their entirety.

BACKGROUND OF THE INVENTION

1. Field of the Invention

The present invention relates to a printed wiring board and a method for manufacturing a printed wiring board.

2. Discussion of the Background

A multilayer printed wiring board, which is formed by alternately laminating conductive circuits and interlayer resin insulation layers on a resin substrate called a core, is described as a printed wiring board. In such a multilayer printed wiring board, conductive circuits formed by means of an interlayer resin insulation layer are connected through via conductors. In a built-up wiring board described in Japanese Laid-Open Patent Publication 2001-168535, a titanium-nitride (TiN) thin film is formed on an insulative body and an electrode or wiring is formed using the titanium-nitride thin film as a base. The contents of this publication are incorporated herein by reference in their entirety.

SUMMARY OF THE INVENTION

According to one aspect of the present invention, a printed wiring board includes a first insulation layer, a first conductive circuit formed on the first insulation layer, a second insulation layer formed on the first insulation layer and the first conductive circuit and having an opening portion reaching the first conductive circuit, a second conductive circuit formed on the second insulation layer, and a via conductor formed in the opening portion and connecting the first conductive circuit and the second conductive circuit. The via conductor is formed an inner-wall surface of the opening portion and has a seed layer including a nitride compound and/or a carbide compound containing Ti, Zr, Hf, V, Nb, Ta or Si and a plated-metal film formed in the opening portion, and the plated-metal film and the first conductive circuit have at least portions making direct contact.

According to another aspect of the present invention, a method for manufacturing a printed wiring board includes forming a first insulation layer, forming a first conductive circuit on the first insulation layer, forming a second insulation layer on the first insulation layer and the first conductive circuit, forming in the second insulation layer an opening portion reaching the first conductive circuit, forming on the inner-wall surface of the opening portion and on a surface of the conductive circuit exposed through the opening portion a seed layer including a nitride compound and/or a carbide compound containing Ti, Zr, Hf, V, Nb, Ta or Si, removing at least a portion of the seed layer formed on the surface of the first conductive circuit such that a portion of the surface of the first conductive circuit is exposed, and performing plating on the seed layer and on the portion of the surface of the first conductive circuit exposed such that a plated-metal film which makes contact with at least a portion of the first conductive circuit is formed in the opening portion.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 5-5G are partially magnified cross-sectional views schematically showing part of the method for manufacturing a printed wiring board according to the first embodiment;

DETAILED DESCRIPTION OF THE EMBODIMENTS

Figure 1:
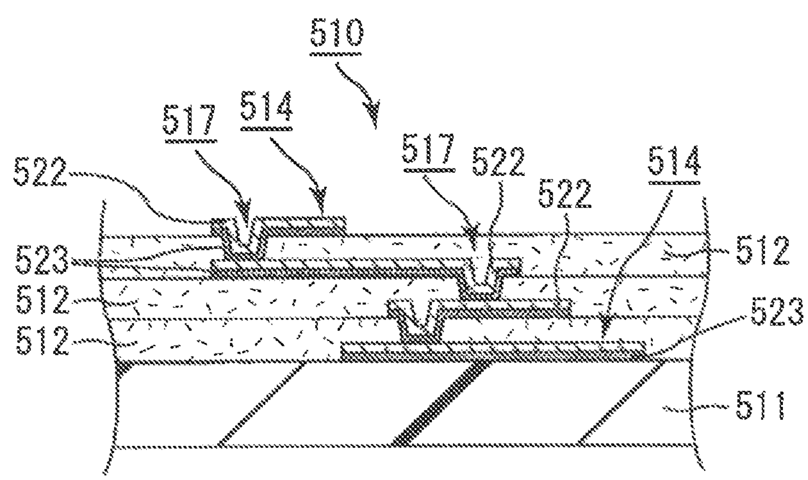
FIG. 1 is a cross-sectional view schematically showing a built-up wiring board in which an electrode or wiring is formed with a titanium-nitride thin film as a base.

The embodiments will now be described with reference to the accompanying drawings, wherein like reference numerals designate corresponding or identical elements throughout the various drawings.

First Embodiment

Here, a printed wiring board and its manufacturing method according to the first embodiment are described.

FIG. 2A is a cross-sectional view schematically showing a printed wiring board of the first embodiment. FIG. 2B is a partially magnified cross-sectional view showing region (a) of the printed wiring board in FIG. 2A. FIG. 2C is a partially magnified cross-sectional view showing region (b) of the printed wiring board in FIG. 2A.

Figure 2:
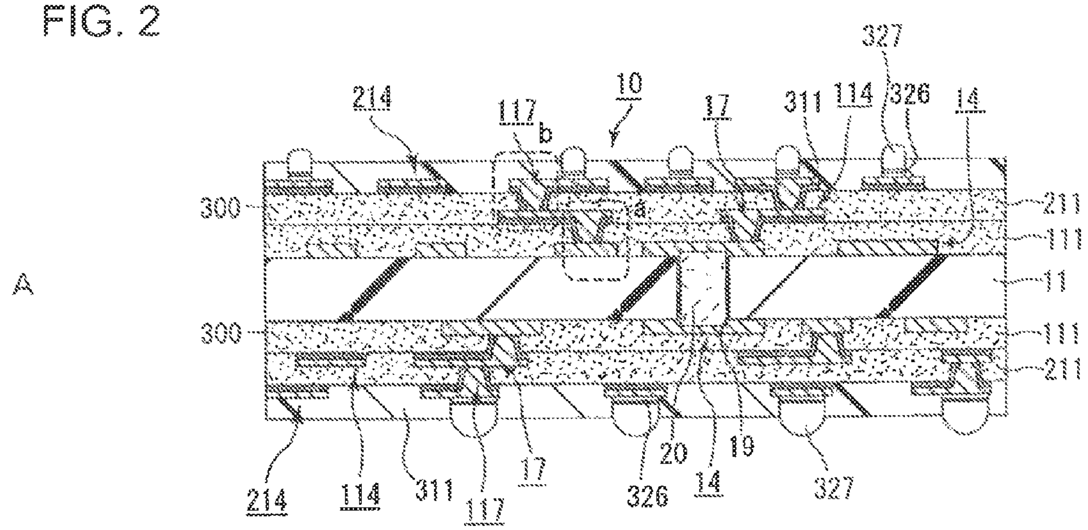
FIG. 2A is a cross-sectional view schematically showing a printed wiring board according to the first embodiment.
FIG. 2B is a partially magnified cross-sectional view showing region (a) of the printed wiring board in FIG. 2A.
FIG. 2C is a partially magnified cross-sectional view showing region (b) of the printed wiring board in FIG. 2A.
Figure 2:
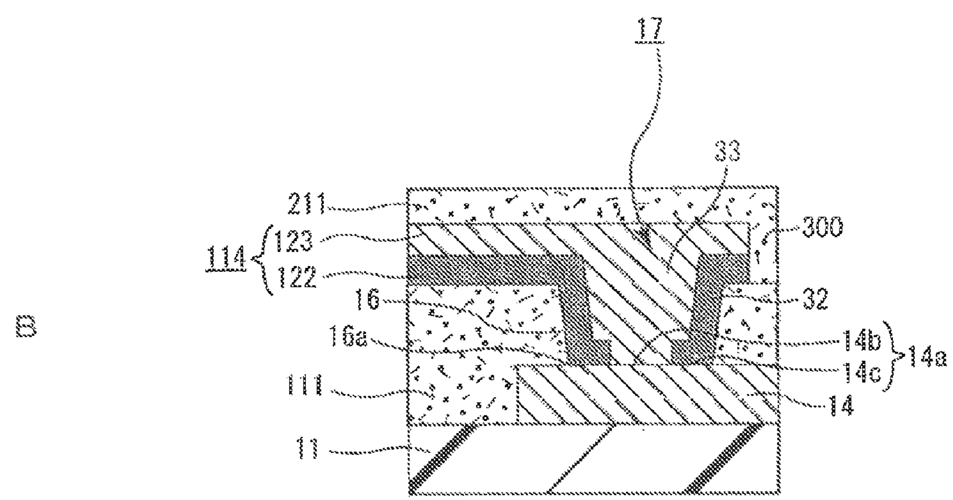
Figure 2:
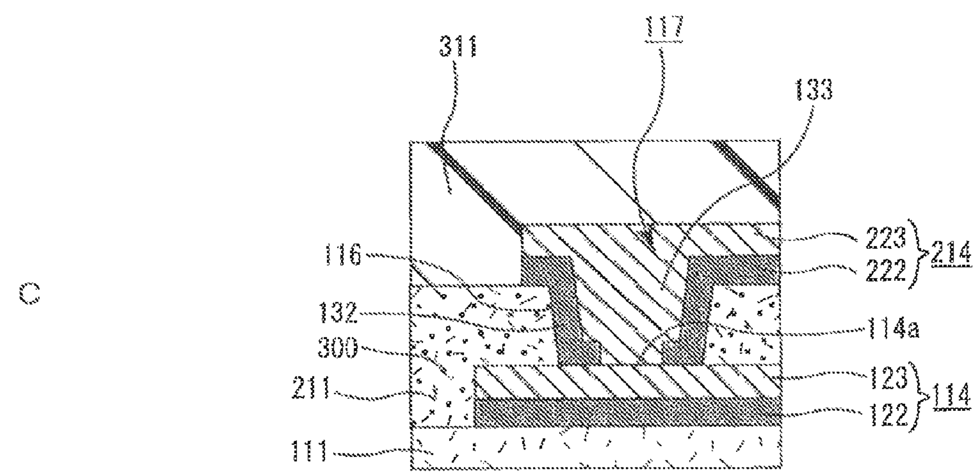

Printed wiring board 10 shown in FIG. 2 has insulative substrate 11 and built-up layers formed on insulative substrate 11, which are formed by alternately forming interlayer resin insulation layers (111, 211) and conductive circuits (14, 114, 214).

Conductive circuits 14 and interlayer resin insulation layers 111 are formed on both surfaces of insulative substrate 11. Conductive circuits 14 formed on both surfaces of insulative substrate 11 are electrically connected by through-hole conductor 19 formed in insulative substrate 11. Conductive circuit 14 and conductive circuit 114 are electrically connected through via conductor 17 formed in interlayer resin insulation layer 111. Conductive circuit 114 and conductive circuit 214 are electrically connected through via conductor 117 formed in interlayer resin insulation layer 211.

In addition, resin filler 20 is filled in through-hole conductor 19. Then, conductive circuit 14 covering resin filler 20 is formed. On the outermost layer of the built-up layers, solder-resist layer 311 is formed. On outermost conductive circuit 214, solder bump 327 is formed by means of solder pad 326. Also, inorganic filler 300 with an average particle diameter of 1.0 μm or smaller is contained in interlayer resin insulation layer 111 and interlayer resin insulation layer 211. As for the inorganic filler, it is not limited specifically; for example, compounds may be listed, such as aluminum compounds, calcium compounds, potassium compounds, magnesium compounds or silicon compounds. Such a compound may be used alone, or two or more kinds may be used together. Silica is especially preferred to be used as inorganic filler.

In printed wiring board 10 with the above structure, insulative substrate 11, interlayer resin insulation layer 111 and interlayer resin insulation layer 211 are insulation layers and work as a first insulation layer or a second insulation layer. In the present specification, when two insulation layers vertically adjacent to each other are noted, the insulation layer positioned inside (the side closer to insulative substrate 11), or insulative substrate 11 itself, is referred to as a first insulation layer, and the other layer positioned outside (the side closer to a surface of printed wiring board 10) is referred to as a second insulation layer. Namely, when noting the relationship of insulative substrate 11 and interlayer resin insulation layer 111, insulative substrate 11 is a first insulation layer and interlayer resin insulation layer 111 is a second insulation layer. On the other hand, when noting the relationship of interlayer resin insulation layer 111 and interlayer resin insulation layer 211, interlayer resin insulation layer 111 is a first insulation layer and interlayer resin insulation layer 211 is a second insulation layer.

In printed wiring board 10 with the above structure, conductive circuit 14, conductive circuit 114 and conductive circuit 214 work as a first conductive circuit or a second conductive circuit. In the present specification, when two conductive circuits vertically adjacent to each other are noted, the conductive circuit positioned inside (the side closer to insulative substrate 11) is referred to as a first conductive circuit, and the conductive circuit positioned outside (the side closer to a surface of printed wiring board 10) is referred to as a second conductive circuit. Namely, when noting the relationship of conductive circuit 14 and conductive circuit 114, conductive circuit 14 is a first conductive circuit and conductive circuit 114 is a second conductive circuit. On the other hand, when noting the relationship of conductive circuit 114 and conductive circuit 214, conductive circuit 114 is a first conductive circuit and conductive circuit 214 is a second conductive circuit.

FIG. 2B shows areas around via conductor 17, which connects conductive circuit 14 (first conductive circuit) and conductive circuit 114 (second conductive circuit). Conductive circuit 14 on insulative substrate 11 (first insulation layer) is made of conductors such as copper foil, electroless copper-plated film and electrolytic copper-plated film. In FIG. 2B, such conductors are not identified, and conductive circuit 14 is shown as a single layer.

Conductive circuit 14 is connected to conductive circuit 114 through via conductor 17. Here, via conductor 17 is made up of seed layer 32, which is formed on the area in contact with the inner-wall surface of opening portion 16 formed in interlayer resin insulation layer 111 (second insulation layer), and of electrolytic copper-plated film 33 which is filled in the other area in opening portion 16. Via conductor 17 has a so-called filled-via structure.

Conductive circuit 114 (second conductive circuit) is made up of seed layer 122 formed on interlayer resin insulation layer 111, and of electrolytic copper-plated film 123 on seed layer 122. Conductive circuit 114 (second conductive circuit) is connected to conductive circuit 14 (first conductive circuit) through via conductor 17.

Surface (14*a*) of conductive circuit 14 (the exposed surface exposed through opening portion 16) has first surface portion (14*b*) directly in contact with electrolytic copper-plated film 33 which forms a via conductor, and second surface portion (14*c*) directly in contact with seed layer 32 which forms the via conductor. Namely, plated-metal film (electrolytic copper-plated film 33) which forms via conductor 17, and conductive circuit 14 are directly connected at first surface portion (14*b*).

As described, part of electrolytic copper-plated film 33 makes direct contact with the surface of conductive circuit 14 without seed layer 32 which forms part of via conductor 17. Namely, electrolytic copper-plated film which forms via conductor 17 is connected to electrolytic copper-plated film which forms conductive circuit 14. Therefore, electrical resistance is low between conductive circuit 14 and via conductor 17, and printed wiring board 10 of the present embodiment has excellent electrical characteristics.

In addition, since electrolytic copper-plated film 33 which forms via conductor 17 is directly formed on exposed surface (14*a*) of conductive circuit 14, peeling seldom occurs between conductive circuit 14 and via conductor 17. Accordingly, connection reliability is enhanced between the conductive circuit and the via conductor. Also, since conductive circuit 14 and via conductor 17, both made of electrolytic copper-plated film, are connected to each other, their connection strength is excellent.

Seed layer 32 is formed on the area in contact with the inner-wall surface of opening portion 16 formed in interlayer resin insulation layer 111 (second insulation layer). In the present embodiment, seed layer 32 is made of a TiN layer formed on the inner-wall surface of opening portion 16, a Ti layer formed on the TiN layer, and a Cu layer formed on the Ti layer. Copper ions contained in electrolytic copper-plated film 33 are prevented from being diffused into interlayer resin insulation layer 111 by the TiN layer forming seed layer 32. The preferred thickness of the seed layer is 100-200 nm, a total of the thickness of each layer forming the seed layer. For example, the thickness of the TiN layer is approximately 60 nm, the thickness of the Ti layer is approximately 20 nm and the thickness of the Cu layer is approximately 100 nm.

Seed layer 32 also makes contact with second-surface portion (14*c*), which is part of surface (14*a*) of conductive circuit 14, and seed layer 32 covers portion (16*a*) (edge portion) where opening portion (16*a*) stands up from surface (14*a*) of conductive circuit 14. Electrolytic copper-plated film 33 is filled over seed layer 32. As described, since seed layer 32 is sandwiched by conductive circuit 14 and electrolytic copper-plated film 33, seed layer 32 adheres to interlayer resin insulation layer 111. As a result, cracks originating in edge portion (16*a*) are prevented from occurring in interlayer resin insulation layer 111.

FIG. 2C shows the area around via conductor 117, which connects conductive circuit 114 (first conductive circuit) and conductive circuit 214 (second conductive circuit). Conductive circuit 114 on interlayer resin insulation layer 111 (first insulation layer) is made of seed layer 122 and of electrolytic copper-plated film 123 on seed layer 122. Conductive circuit 114 is connected to conductive circuit 214 through via conductor 117. Here, via conductor 117 is made of seed layer 132, which is formed in the area in contact with the inner-wall surface of opening portion 116 formed in interlayer resin insulation layer 211 (second insulation layer), and of electrolytic copper-plated film 133 filled in the other area of opening portion 116. Via conductor 117 has a so-called filled-via structure. When noting the section shown in FIG. 2C, different from when noting the section shown in FIG. 2B, conductive circuit 114 works as a first conductive circuit, and interlayer resin insulation layer 111 works as a first insulation layer.

Conductive circuit 214 (second conductive circuit) is made of seed layer 222 formed on interlayer resin insulation layer 211, and of electrolytic copper-plated film 223 on seed layer 222. Conductive circuit 214 (second conductive circuit) is connected to conductive circuit 114 (first conductive circuit) through via conductor 117.

In the section shown in FIG. 2C, the positional relationship of the first conductive circuit, via conductor and second conductive circuit is the same as the section shown in FIG. 2B; part of electrolytic plated-metal film 133 which forms via conductor 117 comes in direct contact with exposed surface (114*a*) of conductive circuit 114. Namely, electrolytic copper-plated film which forms via conductor 117 is connected to electrolytic copper-plated film which forms conductive circuit 114. Therefore, electrical resistance is low between conductive circuit 114 and via conductor 117, and printed wiring board 10 of the present embodiment has excellent electrical characteristics. Also, the inner-wall surface of opening portion 16 is covered with seed layer 132. Copper ions contained in electrolytic copper-plated film 133 are prevented from being diffused into interlayer resin insulation layer 211 by the TiN layer forming seed layer 132.

Next, a method for manufacturing a printed wiring board according to the first embodiment is described by the order of its steps. FIGS. 3A, 3B, 3C, 3D, 3E, 3F and 3G and FIG. 4 are cross-sectional views schematically showing part of the method for manufacturing a printed wiring board according to the first embodiment.

Figure 3:
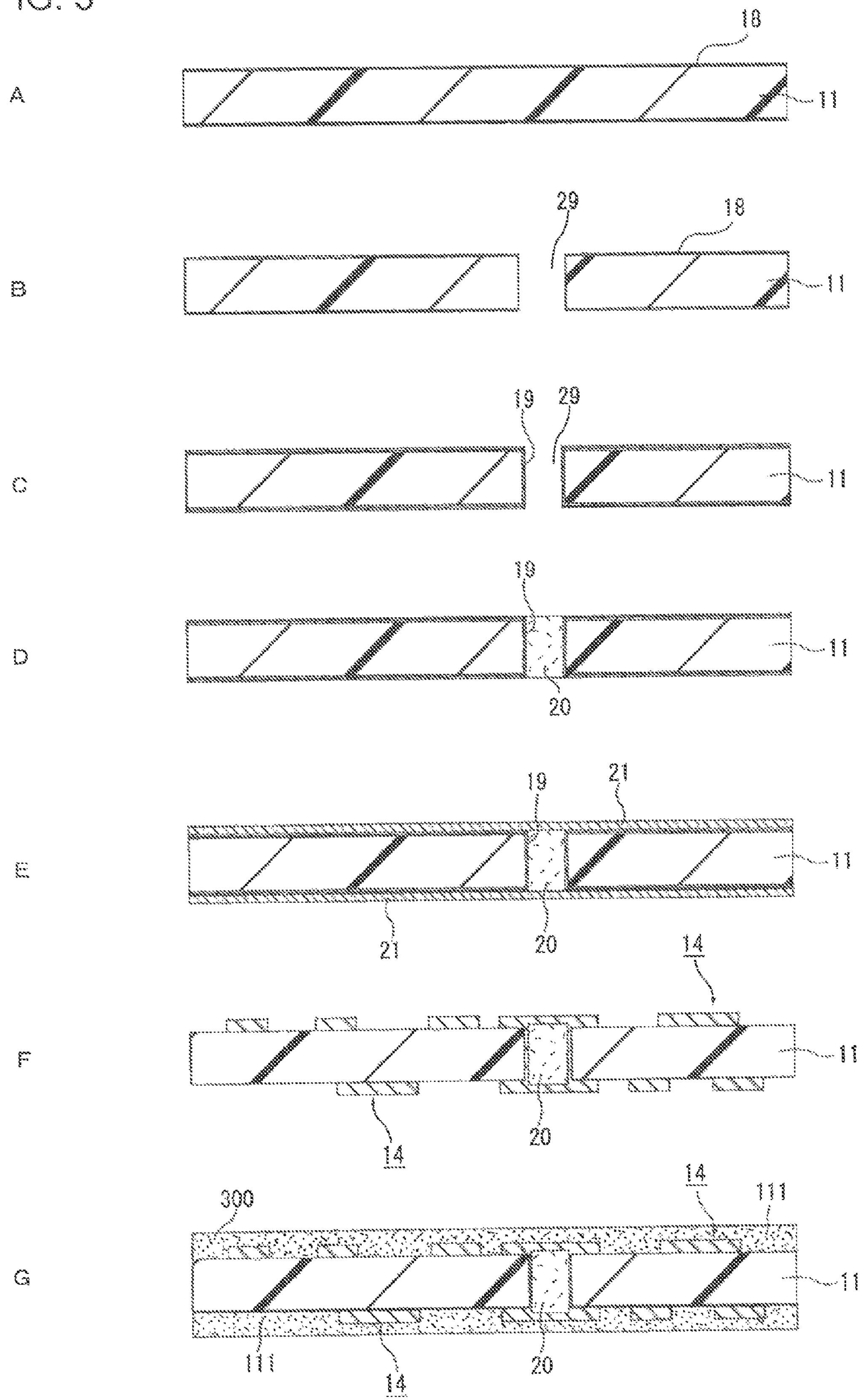
FIGS. 3A-3G are cross-sectional views schematically showing part of the method for manufacturing a printed wiring board according to the first embodiment.

(1) Insulative substrate 11 as shown in FIG. 3A is prepared as a starting material. First, conductive circuits are formed on the insulative substrate. Such an insulative substrate is not limited to any specific type, and the following may be used: for example, substrates containing glass fabric as a core material (such as glass-epoxy substrates), bismaleimide-triazine (BT) resin substrates, copper-clad laminates, resin substrates such as RCC substrates, ceramic substrates such as aluminum nitride substrates, or silicon substrates. FIG. 3A shows a substrate made by laminating copper foil 18 on insulative substrate 11.

The above conductive circuits may be formed, for example, by forming plain conductive layers made of copper through electroless copper plating and electrolytic copper plating or the like performed on the surfaces of the insulative substrate, followed by etching the layers. By forming such electrolytic copper-plated film, the top surfaces of the conductive circuits formed on the insulative substrate are made of electrolytic copper-plated film. Accordingly, when via conductors are formed through electrolytic copper plating in the later process, conductive circuits and via conductors, both made of electrolytic copper-plated film, will be connected to each other. Thus, the electrical characteristics between them will be excellent. In addition, through-hole conductors may be formed to connect conductive circuits sandwiching the insulative substrate.

FIGS. 3B, 3C, 3D, 3E and 3F schematically show an example of the steps to form through-hole conductors and conductive circuits. First, as shown in FIG. 3B, penetrating hole 29 is formed in the substrate using a drill or the like. Then, as shown in FIG. 3C, electroless copper plating and electrolytic copper plating are performed on copper foils 18 and the inner-wall surface of penetrating hole 29. Accordingly, conductive layers, including through-hole conductor 19, are formed with electroless copper-plated film and electrolytic copper-plated film on the electroless copper-plated film. Next, as shown in FIG. 3D, resin filler 20 is filled in through-hole conductor 19. Then, as shown in FIG. 3E, conductive layers 21 are formed by performing electroless copper plating and electrolytic copper plating on substrate surfaces and the surfaces of resin filler 20. Then, as shown in FIG. 3F, conductive circuits 14 are formed at predetermined portions by etching. Here, in FIG. 3F and the subsequent drawings, conductive circuits 14, made of copper foil, electroless copper-plated film and electrolytic copper-plated film, are shown collectively as single-layered. Also, after conductive circuits are formed, the surfaces of the conductive circuits may be roughened by etching or the like according to requirements.

Figure 4:
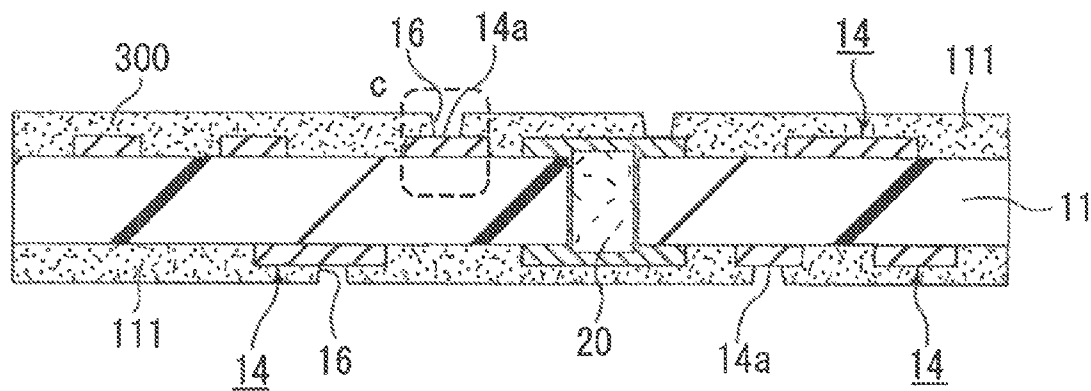
FIG. 4 is a cross-sectional view schematically showing part of the method for manufacturing a printed wiring board according to the first embodiment.

(2) Next, as shown in FIG. 3G, interlayer resin insulation layers 111 are formed on insulative substrate 11 where conductive circuits 14 are formed. Such interlayer resin insulation layers may be formed using thermosetting resins, photosensitive resins, resins in which photosensitive functional groups are attached to part of thermosetting resins, resin complexes containing such resins and thermoplastic resins, or the like. More specifically, first, resin layers are formed by applying uncured resin using a roll coater, a curtain coater or the like or by thermopressing resin film and so forth. After that, such resins are cured according to requirements, and the above opening portions are formed through laser processing or exposure and development treatments. Accordingly, interlayer resin insulation layers with opening portions are formed. If interlayer resin insulation layers are formed with a thermoplastic resin, such layers are formed by thermopressing resin, which is processed as a film. In addition, inorganic filler with an average particle diameter of 1.0 μm or smaller is preferred to be contained in the material for interlayer resin insulation layers. Furthermore, as shown in FIG. 4, opening portions 16 are formed to reach surfaces (14*a*) of conductive circuits 14 in interlayer resin insulation layers 111.

(3) Next, seed layers are formed by sputtering on the surfaces of the interlayer resin insulation layers (including the wall-surfaces of the opening portions). Then, part of the seed layers are removed and electrolytic copper plating is further performed to form via conductors. Such procedures are described in detail using magnified cross-sectional views.

Figure 5:
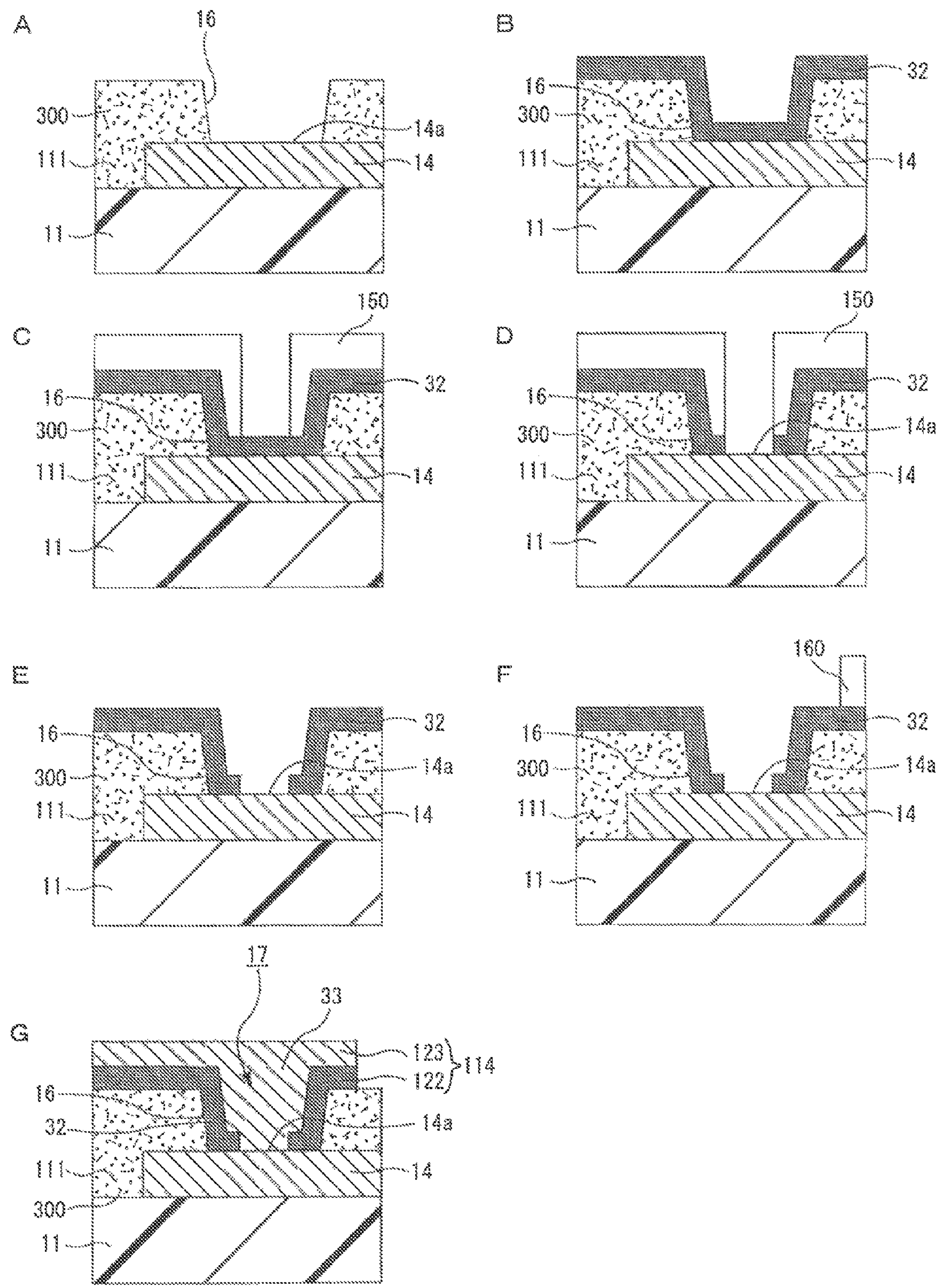

In the following, procedures are described for forming a via conductor in the area around opening portion 16, indicated as region (c) in FIG. 4. FIGS. 5A, 5B, 5C, 5D, 5E, 5F and 5G are partially magnified cross-sectional views schematically showing part of the method for manufacturing a printed wiring board according to the first embodiment. First, as shown in FIG. 5A, a substrate is prepared in which opening portion 16 is formed in interlayer resin insulation layer 111, and surface (14*a*) of conductive circuit 14 is exposed through opening portion 16. Then, by conducting sputtering on the substrate to form a TiN layer, a Ti layer and a Cu layer in that order, seed layer 32 is formed, as shown in FIG. 5B. When forming a TiN layer by sputtering, a sputtering apparatus using Ti as the target and nitrogen as the ambient gas may be used. In the same manner, a Ti layer may be formed using a sputtering apparatus with Ti as the target and argon as the ambient gas. Here, a TiN layer and a Ti layer may be formed using the same apparatus and the same target while switching the ambient gases. When forming a Cu layer by sputtering, the target is switched to Cu and argon is used as the ambient gas. In FIG. 5B, a seed layer made of a TiN layer, a Ti layer and a Cu layer is collectively shown as a single-layered seed layer 32.

Next, as shown in FIG. 5C, in order to keep exposing part of seed layer 32 positioned on surface (14*a*) of conductive circuit 14, resist mask 150 is formed to cover the other areas. The type of such a resist mask is not limited specifically, and a commercially available liquid resist may be used.

Next, as shown in FIG. 5D, the exposed section of seed layer 32 is removed by etching, and surface (14*a*) of conductive circuit 14 is exposed. As for the etching method, a wet etching may be used in which the Cu layer is etched using an etchant containing sulfuric acid and a hydrogen peroxide solution, and then the Ti layer and the TiN layer are etched using an etchant containing potassium hydroxide and a hydrogen peroxide solution. Alternatively, a dry etching method such as RIE (reactive ion etching) may be used.

Next, as shown in FIG. 5E, resist mask 150 is removed. Then, as shown in FIG. 5F, plating resist 160 is formed at predetermined positions on interlayer resin insulation layer 111. Such a plating resist is formed in areas where neither a conductive circuit nor a via conductor is formed. The method for forming such a resist is not limited specifically; for example, the resist may be formed after laminating a photosensitive dry film and conducting exposure and development treatments.

Next, electrolytic copper plating is performed on areas on seed layer 32 where plating resist 160 is not formed and on surface (14*a*) where conductive circuit 14 is exposed. By such electrolytic copper plating, opening portion 16 is filled with electrolytic copper-plated film 33. Since seed layer 32 does not exist on surface (14*a*) where conductive circuit 14 is exposed, surface (14*a*) of conductive circuit 14 and electrolytic copper-plated film 33 are directly connected without seed layer 32. Here, the electrolytic copper plating may be performed by a well-known conventional method. Also, the thickness of the electrolytic copper-plating is preferred to be between 5-20 μm. In this step, seed layer 32 and exposed surface (14*a*) of conductive circuit 14 work as seed layers for electrolytic copper plating.

Next, as shown in FIG. 5G, plating resist 160 on interlayer resin insulation layer 111 is removed. Such removal may be conducted using, for example, an alkaline solution containing amines. Next, the seed layer exposed by the removal of the plating resist is removed using an etchant.

Through the above step, via conductor 17 is formed in opening portion 16 and at the same time, conductive circuit 114 integrated with via conductor 17 is formed. Then, conductive circuit 114 (second conductive circuit) and conductive circuit 14 (first conductive circuit) are connected through via conductor 17.

(4) Furthermore, according to requirements, a step to form interlayer resin insulation layers, a step to form opening portions in the interlayer resin insulation layers and a step to form via conductors and conductive circuits are carried out.

Figure 6:
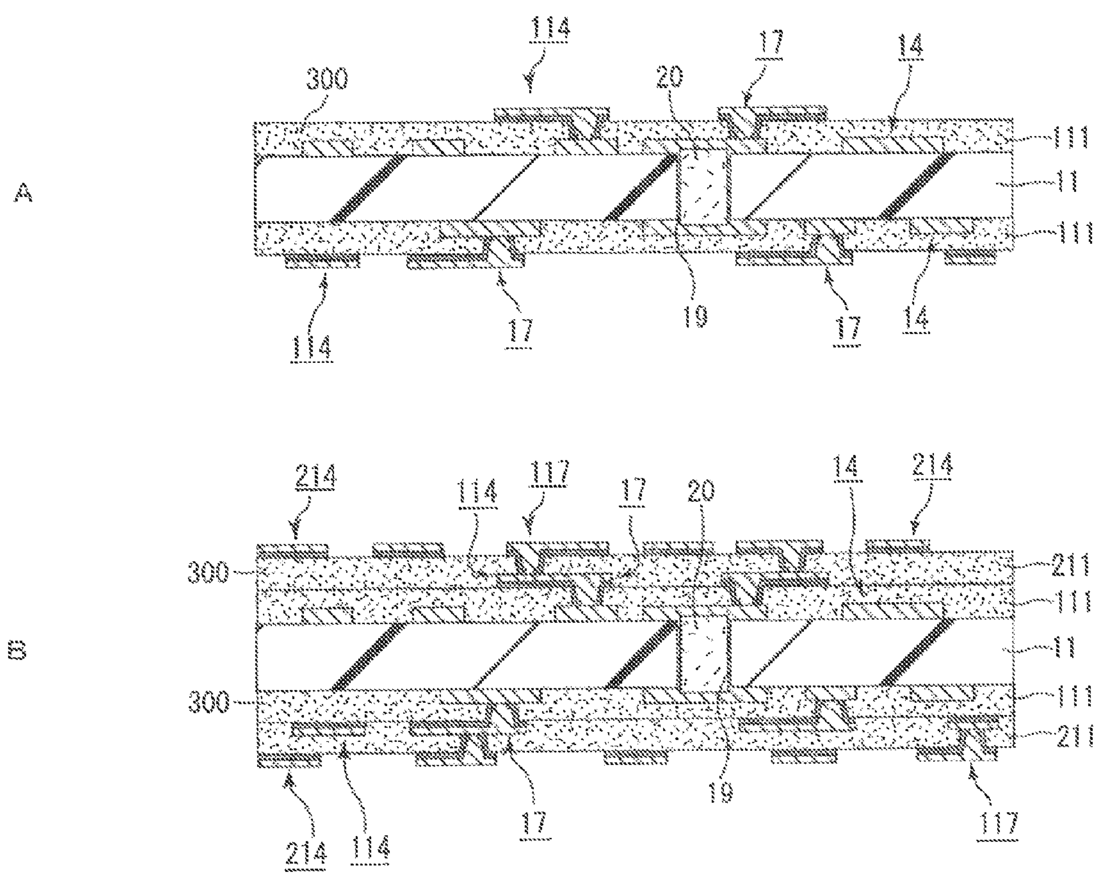
FIGS. 6A and 6B are cross-sectional views schematically showing part of the method for manufacturing a printed wiring board according to the first embodiment.

FIGS. 6A and 6B are cross-sectional views schematically showing part of the method for manufacturing a printed wiring board according to the first embodiment. FIG. 6A schematically shows a board where steps (1)-(3) have been conducted to form via conductors 17 and conductive circuits 114. On such a board, interlayer resin insulation layers 211, via conductors 117 and conductive circuits 214 may be formed in the upper-layer parts as shown in FIG. 6B by carrying out a step to form interlayer resin insulation layers, a step to form opening portions in the interlayer resin insulation layers and a step to form via conductors and conductive circuits, the same as above steps (2) and (3).

(5) Lastly, solder-resist layers and solder bumps are formed and a printed wiring board will be completed.

Figure 7:
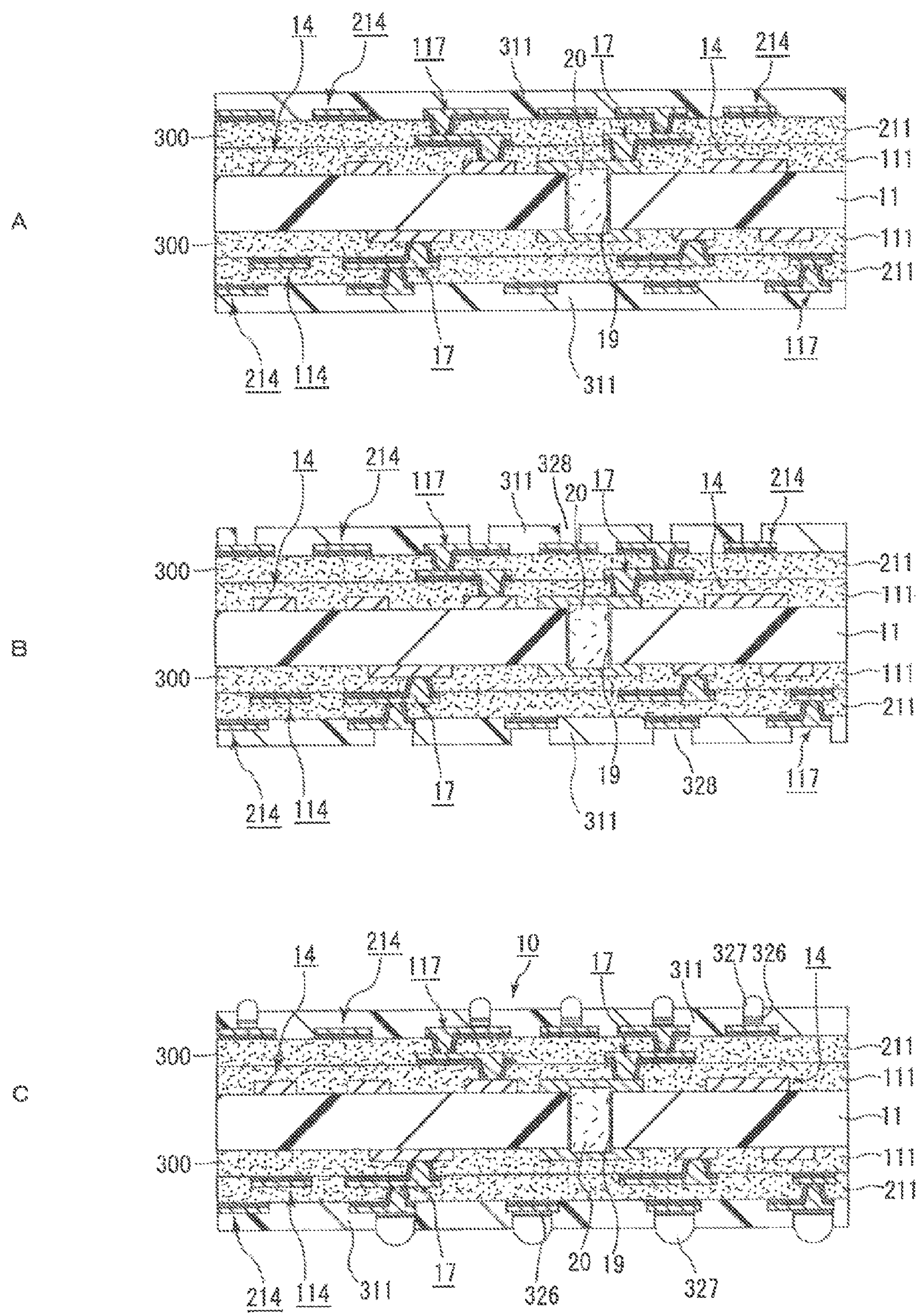
FIGS. 7A-7C are cross-sectional views schematically showing part of the method for manufacturing a printed wiring board according to the first embodiment.

FIGS. 7A, 7B and 7C are cross-sectional views schematically showing part of the method for manufacturing a printed wiring board according to the first embodiment. First, as shown in FIG. 7A, a solder-resist composition is applied by a roll-coating method or the like on uppermost interlayer resin insulation layers 211 including conductive circuits 214. Then, opening treatments such as laser processing, exposure and development treatments or the like are conducted, the resin is cured, and solder-resist layers 311 are formed. Next, as shown in FIG. 7B, openings 328 are formed in solder-resist layers 311. Then, as shown in FIG. 7C, by forming solder pads 326 and solder bumps 327 in openings 328, manufacturing printed wiring board 10 is finished.

In the following, functions and effects of a printed wiring board and its manufacturing method according to the first embodiment are listed.

(1) In a printed wiring board according to the present embodiment, plated-metal film which forms a via conductor makes direct contact with a first conductive circuit at least in one section. Since no foreign metal exists as a seed layer between them, electrical resistance is low between the via conductor and the first conductive circuit, and electrical characteristics are excellent.

(2) In a printed wiring board according to the present embodiment, on the inner-wall surface of an opening portion in a second insulation layer where the insulation layer and a via conductor come in contact, a seed layer including TiN is arranged. Thus, copper ions forming a plated-metal film are prevented from being diffused.

(3) A printed wiring board according to the present embodiment has a so-called filled via structure where plated-metal film is filled in an opening portion. Thus, reliability will be enhanced when connecting a first conductive circuit and a second conductive circuit through a filled via.

(4) In a printed wiring board according to the present embodiment, a seed layer covers the area (edge portion) where an opening portion stands up from the surface of a conductive circuit. Since the seed layer is sandwiched by a plated-metal film which forms a via conductor and a first conductive circuit, the seed layer adheres to the insulation layer. As a result, cracks originating in the edge portion will be prevented from occurring in the interlayer resin insulation layer.

(5) In a printed wiring board according to the present embodiment, a seed layer is made of a TiN layer formed on the inner-wall surface of an opening portion, a Ti layer formed on the TiN layer and a Cu layer formed on the Ti layer. A TiN layer has a barrier function to prevent diffusion of metal ions. Also, if a Cu layer is present on the surface of a seed layer, it is suitable for forming electrolytic copper-plated film in an opening portion. In addition, by forming a Ti layer between a TiN layer and a Cu layer, adhesiveness may be enhanced between the TiN layer and the Cu layer.

(6) In a method for manufacturing a printed wiring board according to the present embodiment, at least a section of the seed layer formed on the surface of a first conductive circuit is removed to expose the surface of the first conductive circuit. Then, electrolytic copper plating is performed on the exposed surface of the first conductive circuit to form a plated-metal film connected to the first conductive circuit at least in one section. By doing so, a printed wiring board may be manufactured where a plated-metal film and a first conductive circuit are directly connected at least in one section. Since the manufactured printed wiring board does not have metal as a seed layer between the plated-metal film and the first conductive circuit, electrical resistance between the plated-metal film and the first conductive circuit is low in the printed wiring board.

(7) In a method for manufacturing a printed wiring board according to the present embodiment, a seed layer is formed by sputtering. When forming a seed layer by sputtering, a thin film may be formed without roughening the insulation layer. Thus, variations in the thickness of the thin film may be reduced. Then, when such a thin film is etched, since unnecessary thin film will not remain, short circuits are prevented.

(8) In a method for manufacturing a printed wiring board according to the present embodiment, inorganic filler with an average particle diameter of 1.0 μm or smaller is contained in interlayer resin insulation layers. If the average particle diameter of inorganic filler is 1.0 μm or smaller, the inorganic filler will be prevented from protruding excessively from the inner-wall surface of an opening portion after a desmearing treatment. If an excessive amount of inorganic filler protrudes, when a seed layer is formed by sputtering on the opening portion, it is difficult to form a film in areas behind the protruding inorganic filler. However, since the inorganic filler is prevented from excessive protrusion in the present embodiment, a seed layer may be formed evenly while conforming to the opening portion. Then, if a seed layer is formed evenly by conforming to the opening portion, it is possible to enhance the results of filling with plating when forming a via conductor. Furthermore, since a seed layer is formed on the entire side surface of a via conductor, copper ions may be effectively suppressed from being diffused into the interlayer resin insulation layer.

In the following, the first embodiment is further described in detail by referring to an example. However, the embodiment of the present invention is not limited to such an example.

Example 1

A. Preparation of Resin Filler

The following were put in a container and mixed by blending them to prepare a resin filler with a viscosity of 45-49 Pa·s at 23±1° C.: bisphenol F-type epoxy monomer (YL983U, molecular weight: 310, made by Japan Epoxy Resins Co., Ltd.) 100 parts by weight; $SiO_2$ spherical particles whose surfaces are coated with a silane coupling agent, and whose average particle diameter is 1.6 μm and maximum particle diameter is 15 μm or smaller (CRS1101-CE made by Atotech Japan) 170 parts by weight; and a leveling agent (Perenol S4, made by San Nopco Limited) 1.5 parts by weight.

As a curing agent, an imidazole curing agent (2E4MZ-CN, made by Shikoku Chemicals Corporation) 6.5 parts by weight, was used.

B. Manufacturing a Printed Wiring Board (1) A copper-clad laminate, in which copper foils with a thickness of 18 μm were laminated on both surfaces of an insulative substrate made of 0.8 mm-thick glass epoxy resin, was used as a starting material. Next, the copper-clad laminate was drilled to form penetrating holes for through-hole conductors.

Next, on the copper foils and the inner-wall surfaces of penetrating holes, electroless copper plating and electrolytic copper plating were performed to form conductive layers including through-hole conductors which were made up of electroless copper-plated film and electrolytic copper-plated film on the electroless copper-plated film.

(2) Next, the substrate with through-hole conductors was washed with water and dried. Then, a black oxide treatment was conducted using a solution as a black oxide bath (oxidation bath) which contains NaOH (10 g/l), $NaClO_2$ (40 g/l) and $Na_3PO_4$ (6 g/l), followed by a reduction treatment using a solution as a reduction bath which contains NaOH (10 g/l) and $NaBH_4$ (6 g/l). Accordingly, the surfaces of through-hole conductors were roughened.

(3) Next, the resin filler described in (A) above was filled in through-hole conductors under the following process. Namely, the resin filler was squeezed into through-hole conductors using a squeegee and dried under conditions of 100° C. for 20 minutes. Then, one side of the substrate was belt-sanded using #600 belt polishing paper (made by Sankyo-Rikagaku Co., Ltd.) so that the resin filler does not remain on the electrolytic copper-plated film. Then, the substrate was buff-sanded to remove scratches by the above belt-sander polishing. Such a series of polishings was also conducted on the other surface of the substrate. Then, heat treatments were conducted at 100° C. for an hour, at 120° C. for three hours, at 150° C. for an hour, and at 180° C. for seven hours to form resin filler layers.

(4) Next, conductive layers made up of electroless copper-plated film and electrolytic copper-plated film were formed on the electrolytic copper-plated films and on resin filler layers. Then, conductive circuits were formed on the insulative substrate and on the resin filler using a subtractive method.

(5) Next, the above substrate was washed with water and degreased using acid, then soft-etched. Then, by spraying an etchant on both surfaces of the substrate, the surfaces of the conductive circuits were etched. Accordingly, the entire surfaces of the conductive circuits were roughened. As for the etchant, an etchant (MEC Etch Bond, made by MEC Co., Ltd.) containing an imidazole copper (II) complex 10 parts by weight, glycolic acid 7 parts by weight and potassium chloride 5 parts by weight was used.

(6) Next, interlayer resin insulation layers were formed on the insulative substrate and conductive circuits using a film for interlayer resin insulation layers (ABF, made by Ajinomoto Fine-Techno Co., Inc.) containing silica particles with an average particle diameter of 1.0 μm as inorganic filler. Namely, resin film for interlayer resin insulation layers was laminated on the substrate under the conditions of vacuum degree 65 Pa, pressure 0.4 MPa, temperature 80° C. and time 60 seconds, then cured at 170° C. for 30 minutes.

(7) Next, opening portions with an approximate diameter of 60 μm were formed in the interlayer resin insulation layers using $CO_2$ gas laser. As a result, sections of the upper surfaces (exposed surfaces) of the conductive circuits were exposed through opening portions.

In the following, a process was conducted to form via conductors in the opening portions.

(8) Sputtering was conducted using Ti as the target, and nitrogen as the ambient gas. A TiN layer was formed. Next, by leaving Ti as the target, but switching the ambient gas to argon, sputtering was further conducted to form a Ti layer. Then, by switching the target to Cu and using argon as the ambient gas, a Cu layer was formed. Accordingly, a seed layer was formed with the film thicknesses of TiN=60 nm, Ti=20 nm and Cu=100 nm.

(9) Next, application of a liquid resist and exposure and development treatments were conducted to form a resist mask in certain areas so that the seed layer formed on the surfaces of the conductive circuits will be exposed. Then, from the exposed area of the seed layer, the Cu layer was etched away using an etchant containing sulfuric acid and a hydrogen peroxide solution, and then the Ti layer and the TiN layer were removed by etching using an etchant containing potassium hydroxide and a hydrogen peroxide solution. The surfaces of the conductive circuits were exposed.

(10) Next, the resist mask was removed using a commercially available etchant. Furthermore, a commercially available photosensitive dry film was laminated, exposed to light and developed. Accordingly, plating resist with a thickness of 25 μm was formed in areas where neither a conductive circuit nor a via conductor would be formed.

(11) Next, the substrate with plating resist was washed with 50° C. water to degrease, washed with 25° C. water and further cleansed with sulfuric acid. Then, electrolytic plating was performed under the following conditions to fill plated-metal film in the opening portions while forming conductive circuits on interlayer resin insulation layers.

[Electrolytic Copper Plating Solution]

| | |
|---|---|
| sulfuric acid | 150 g/L |
| copper sulfate | 150 g/L |
| chloride ion | 8 mg/L |
| additives | |
| (Top Lucina NSV-1, made by Okuno Chemical Industries Co., Ltd.) | 4 ml/L |
| (Top Lucina NSV-2, made by Okuno Chemical Industries Co., Ltd.) | 0.5 ml/L |
| (Top Lucina NSV-3, made by Okuno Chemical Industries Co., Ltd.) | 1 ml/L |

[Electrolytic Plating Conditions]

| | |
|---|---|
| current density | 1 A/dm$^2$ |
| time | 90 minutes |
| temperature | 23° C. |

A section of the plated-metal film formed inside an opening portion was in direct contact with the surface of a lower-layer conductive circuit.

(12) Next, the plating resist was removed. In addition, the seed layer exposed by the removal of the plating resist was removed using an etchant containing sulfuric acid and a hydrogen peroxide solution along with an etchant containing potassium hydroxide and a hydrogen peroxide solution.

Via conductors and conductive circuits were formed through the above steps.

(13) Furthermore, by the same etchant used in the above step (5), the surfaces of the conductive circuits and the via conductors were roughened. Then, the same as in the above steps (6) and (7), interlayer resin insulation layers with opening portions were formed.

(14) Next, by the same method used in the above steps (8)-(12), conductive circuits and via conductors were formed.

(15) Next, on the outermost interlayer resin insulation layers and conductive circuits, a commercially available solder-resist composition was applied to be 30 μm thick, then dried at 70° C. for 20 minutes and at 70° C. for 30 minutes. Accordingly, solder-resist composition layers were formed.

(16) Next, a 5-mm thick photo mask with patterns for forming solder-bump openings was adhered to the solder-resist composition layers, which were then exposed to ultraviolet rays at 1000 mJ/cm$^2$, and developed using a DMTG solution. Accordingly, openings for forming solder bumps were formed.

Then, the solder-resist composition layers were cured by heat processing under conditions of 80° C. for an hour, 100° C. for an hour, 120° C. for an hour and 150° C. for three hours. Accordingly, solder-resist layers (20 μm thick) with openings for forming solder bumps were formed.

(17) Next, the substrate with solder resist layers was immersed for 20 minutes in an electroless nickel plating solution of pH=4.5 containing nickel chloride ($2.3\times10^{-1}$ mol/l), sodium hypophosphite ($2.8\times10^{-1}$ mol/l) and sodium citrate ($1.6\times10^{-1}$ mol/l), and a 5 μm-thick nickel-plated layer was formed in solder-bump openings. Furthermore, the substrate was immersed for 7.5 minutes in an electroless gold plating solution at 80° C. containing gold potassium cyanide ($7.6\times10^{-3}$ mol/l), ammonium chloride ($1.9\times10^{-1}$ mol/l), sodium citrate ($1.2\times10^{-1}$ mol/l) and sodium hypophosphite ($1.7\times10^{-1}$ mol/l), and a 0.03 μm-thick gold-plated layer was formed on the nickel-plated layer to make solder pads.

(18) Next, solder paste was printed in solder-bump openings formed in the solder resist layers, and solder bumps were formed through a reflow process at 200° C. Accordingly, a printed wiring board was completed.

Assumption of Resistance Values of Via Conductors

The effect of a seed layer on the resistance value of a via conductor was assumed using a method described below.

Figure 8:
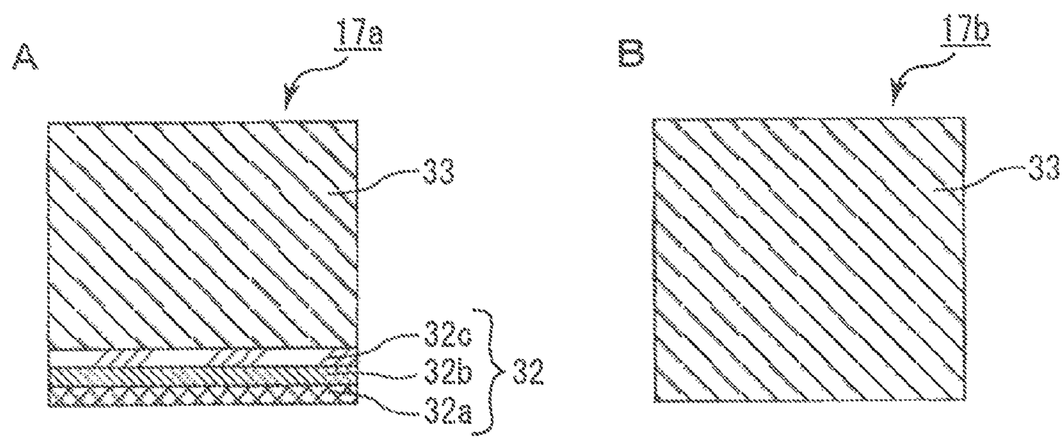
FIGS. 8A and 8B are cross-sectional views schematically showing a method for assuming resistance values of via conductors.

FIGS. 8A and 8B are cross-sectional views schematically showing a method for assuming resistance values of via conductors. FIG. 8A schematically shows an example in which a seed layer is formed on the entire bottom portion of a via conductor; and FIG. 8B schematically shows an example in which a via conductor does not have a seed layer. Via conductor (17*a*) shown in FIG. 8A is shaped as a circular pillar with a diameter of 60 μm. Seed layer 32 is formed on the entire bottom portion of via conductor (17*a*), and seed layer 32 is made of 60 nm-thick TiN layer (32*a*), 20 nm-thick Ti layer (32*b*) and 100 nm-thick Cu layer (32*c*) from the bottom in that order. Electrolytic copper-plated film 33 with a thickness of 10 μm is formed on seed layer 32. By contrast, via conductor (17*b*) shown in FIG. 8B is the same shape as that of via conductor (17*a*), and is entirely made of electrolytic copper-plated film 33. The thickness of the electrolytic copper-plated film is 10.18 μm.

Resistance values in a vertical direction (from the top surface of the pillar toward the bottom surface) of via conductor (17*a*) and via conductor (17*b*) were assumed using the procedures shown below.

The resistivity of electrolytic copper-plated film 33 was set at 1.68 Ω/cm, the resistivity of Cu layer 32 was set at 10 Ω/cm, the resistivity of Ti layer (32*b*) was set at 150 Ω/cm and the resistivity of TiN layer (32*a*) was set at 300 Ω/cm. Such resistivity values were obtained by forming a plain film using the same material for each layer and measuring their resistance values. Then, the resistance value of each layer of via conductor (17*a*) was calculated based on the via diameter and the thickness of each layer: 59μΩ in electrolytic copper-plated film 33, 4μΩ in Cu layer 32, 11μΩ in Ti layer (32*b*) and 64μΩ in TiN layer (32*a*), and the entire resistance value of via conductor (17*a*) was 137μΩ. On the other hand, the resistance value of via conductor (17*b*) was 61μΩ in electrolytic copper-plated film 33, and that was the resistance value in the entire via conductor (17*b*).

Namely, in via conductor (17*a*) where seed layer 32 exists, the resistance value was approximately 2.3 times as high as in via conductor (17*b*) without seed layer 32. The resistance value was assumed to be very high.

In a printed wiring board of the present invention, since plated-metal film which forms a via conductor makes direct contact with a first conductive circuit at least in one section, it is assumed that the electrical resistance is low between the plated-metal film and the first conductive circuit, and that the electrical characteristics are excellent.

Second Embodiment

In a printed wiring board of the present embodiment, a metal layer containing Sn is further formed on areas of the surfaces of conductive circuits which come in contact with insulation layers. In addition, a coating made of a coupling agent is further formed on the metal layer.

Figure 9:
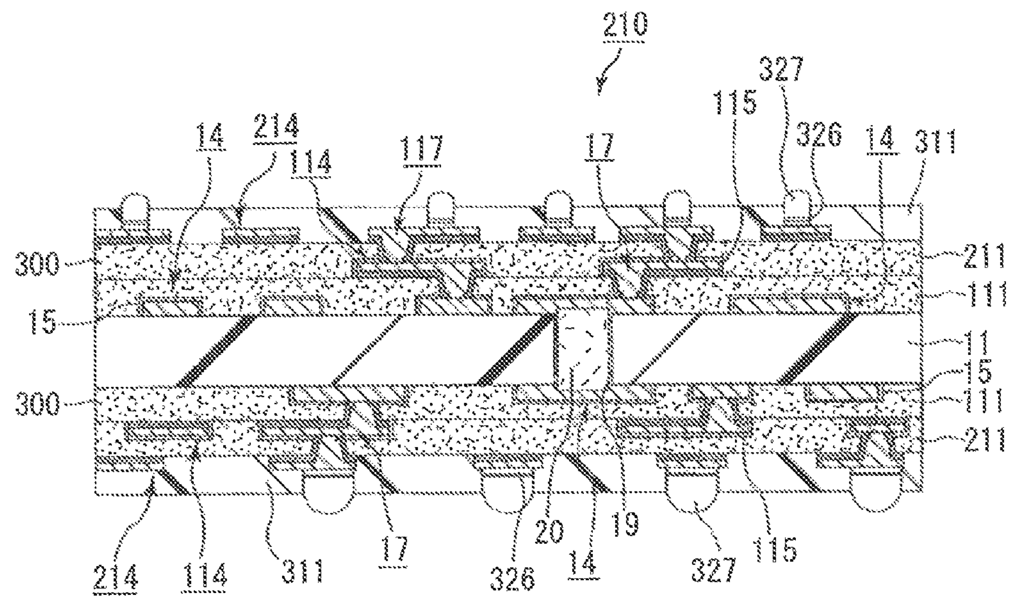
FIG. 9 is a cross-sectional view schematically showing a printed wiring board according to the second embodiment.

FIG. 9 is a cross-sectional view schematically showing a printed wiring board according to the second embodiment. In printed wiring board 210 of the second embodiment, a metal layer containing Sn is formed on the surfaces of conductive circuit 14, and a coating made of a silane coupling agent is further formed on the metal layer (hereinafter, such a metal layer and a coating on the metal layer are altogether referred to as a conductive-circuit coating layer, and shown as conductive-circuit coating layer 15 in FIG. 9). In addition, conductive-circuit coating layer 115 is formed on the surfaces of conductive circuit 114. Among the surfaces of conductive circuit 14 and conductive circuit 114, such a conductive-circuit coating layer is not formed on areas which are in contact with via conductor 17 or via conductor 117.

As such, if a metal layer containing Sn is formed on predetermined portions of the surfaces of a conductive circuit, and a coating made of a silane coupling agent is further formed on the metal layer, the conductive circuit and an interlayer resin insulation layer will be strongly adhered by means of the metal layer and the coating.

FIG. 9 shows an embodiment where a conductive-circuit coating layer is formed both on the surfaces of conductive circuit 14 and on the surfaces of conductive circuit 114. However, a conductive-circuit coating layer is not required to be formed on the surfaces of all conductive circuits. A conductive-circuit coating layer may be formed only on the surfaces of conductive circuit 14 or on the surfaces of conductive circuit 114.

The printed wiring board of the second embodiment having the above structure may be manufactured by modifying a method for manufacturing a printed wiring board according to the first embodiment as follows. Namely, in a substrate where conductive circuits are formed by a method for manufacturing a printed wiring board according to the first embodiment (see FIG. 3F), a metal layer containing Sn is formed on the entire exposed surfaces (upper and side surfaces) of conductive circuits. As for the method for forming a metal layer containing Sn, for example, a tin displacement plating method, an electroless tin plating method, an electrolytic tin plating method, a fused-tin immersion method and the like are listed.

Next, by forming a coating made of a silane coupling agent on the metal layer, a conductive-circuit coating layer is formed. Here, the coating is formed by, for example, spraying a solution containing a silane coupling agent on the surfaces of conductive circuits followed by a drying process.

Next, as described in the first embodiment, interlayer resin insulation layers are formed and opening portions are formed in the interlayer resin insulation layers. Then, portions of a conductive-circuit coating layer exposed through the opening portions are removed. As the method for removing a metal layer, methods using a permanganic acid solution or the like are listed. Using a permanganic acid solution, the metal layer containing Sn may be completely removed. In addition, when forming opening portions in interlayer resin insulation layers using laser processing, an exposure and development treatment or the like, and/or when removing a metal layer by a method using a permanganic acid solution or the like, the coating on the metal layer will also be removed when the metal layer is removed in the present step.

After the above, a printed wiring board may be manufactured by conducting step (3) and the subsequent steps in the method for manufacturing a printed wiring board according to the first embodiment.

The functions and effects of a printed wiring board and a method for manufacturing a printed wiring board according to the second embodiment will be listed below.

(9) In a printed wiring board according to the present embodiment, a metal layer containing Sn is further formed in areas of the surfaces of conductive circuits which make contact with an insulation layer. A coating made of a silane coupling agent is further formed on the metal layer. With such a structure, adhesiveness may be enhanced between a conductive circuit and an insulation layer formed thereon.

Other Embodiments

Figure 10:
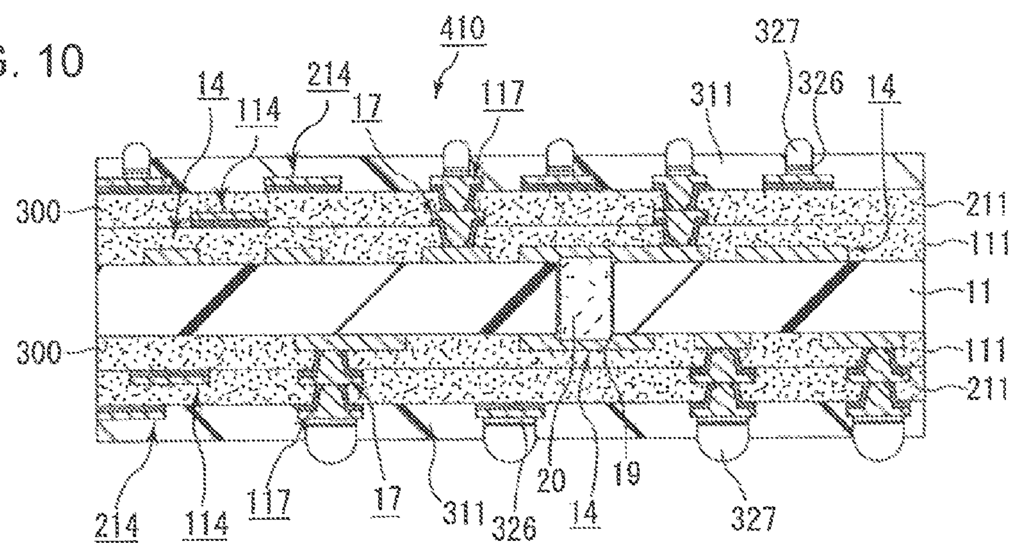
FIG. 10 is a cross-sectional view schematically showing an example according to another embodiment of a printed wiring board of the present invention.

In a printed wiring board of the present invention, via conductors may have a stacked via structure. FIG. 10 is a cross-sectional view schematically showing an example according to another embodiment of a printed wiring board of the present invention. Printed wiring board 410 shown in FIG. 10 has a so-called stacked-via structure where via conductors 117 are formed directly on via conductors 17. Since signal transmission time is reduced in a printed wiring board having via holes with a stacked-via structure, it is easier to deal with high-speed requirements in printed wiring boards. Also, since the degree of freedom when designing conductive circuits increases, it is easier to deal with highly integrated printed wiring boards.

In each embodiment above, the seed layer is a three-layer structure containing a TiN layer, Ti layer and a Cu layer. However, the structure of a seed layer is not limited to such. For example, it is sufficient if a seed layer has at least one barrier layer to prevent metal ions such as copper ions from being diffused into insulation layers. As layers with barrier functions, nitride compounds or carbide compounds containing Ti, Zr, Hf, V, Nb, Ta or Si may be listed. More specifically, TiC, TiN, ZrC, ZrN, HfC, HfN, VC, VN, NbC, NbN, TaC, $Ta_4N_5$, $Ta_5N_6$, TaN, $Ta_2N$ and SiC, $Si_3N_4$ may be listed. A seed layer may contain one kind from among those layers with barrier functions, or may contain multiple kinds. Alternatively, a seed layer may contain layers other than the layers with barrier functions listed above.

When the interlayer resin insulation layers are formed using thermosetting resin, thermosetting resins such as epoxy resin, phenol resin, polyimide resin, polyester resin, bismaleimide resin, polyolephin resin, polyphenylene ether resin, polyphenylene resin and fluororesin may be used. If the interlayer resin insulation layers are formed using photosensitive resin, then acrylic resin or the like, for example, may be used as the photosensitive resin. Also, interlayer resin insulation layers are not always required to contain inorganic filler.

Also, when opening portions are formed in the interlayer resin insulation layers by laser processing, carbon-dioxide gas lasers, ultraviolet lasers, excimer lasers or the like, for example, may be used for the laser processing. In addition, after forming opening portions, a desmearing treatment may be conducted according to requirements.

The number of layers of interlayer resin insulation layers and conductive circuits in a printed wiring board is not limited to the number of layers shown in the first embodiment, and further multiple layers may also be employed. In addition, a single-sided board may also be employed instead of a double-sided board. Furthermore, in a method for manufacturing a printed wiring board according to the first embodiment, the total number of interlayer resin insulation layers is the same on both surfaces of an insulative substrate. However, the total number may be different on either side of the insulative substrate.

In a printed wiring board according to one embodiment of the present invention, a plated-metal film which forms a via conductor makes direct contact with a first conductive circuit at least in one section. Since there is no metal as a seed layer between them, the electrical resistance is low between the via conductor and the first conductive circuit, and the electrical characteristics are excellent. Also, on the inner-wall surface of an opening, a seed layer made of at least one kind of nitride compound or carbide compound containing Ti, Zr, Hf, V, Nb, Ta or Si is formed. The compound to make the seed layer functions as a so-called barrier to prevent metal ions such as copper ions from becoming diffused into the second insulation layer. In a printed wiring board of the present invention, since a seed layer is arranged in areas where insulation layers and via conductors come in contact, metal ions forming plated-metal films are prevented from being diffused.

The above plated-metal film may be made of copper. If a plated-metal film is made of copper, due to its low resistance values, a printed wiring board may be formed with especially excellent electrical characteristics. In addition, since a seed layer is arranged on the inner-wall surface of an opening portion, copper ions are prevented from being diffused into the second insulation layer.

The plated-metal film may be filled in the opening portion. The structure in which a plated-metal film is filled in an opening portion is a so-called filled-via structure. With a filled-via structure, reliability is enhanced when connecting the first conductive circuit and the second conductive circuit through a filled via. Moreover, since a so-called stacked-via structure where a filled via is formed directly on a filled via may also be employed, a signal transmission route may be shortened.

The first conductive circuit may have a first surface portion directly in contact with the plated-metal film and a second surface portion directly in contact with the seed layer. Such a structure leads to a state in which a seed layer covers the area of an opening portion which stands up from the surface of a first conductive circuit (hereinafter referred to as an edge portion). Then, by being sandwiched between the plated-metal film which forms the via conductor and the first conductive circuit, the seed layer is adhered to the insulation layer. As a result, cracks originating near the edge portion may be prevented from developing.

The seed layer may be formed by sputtering. If a seed layer is formed by sputtering, a thin film may be formed without roughening an insulation layer, thus variations in the thickness of the thin film may be reduced.

The seed layer may be made up of a TiN layer formed on the inner-wall surface of the opening portion, a Ti layer formed on the TiN layer, and a Cu layer formed on the Ti layer. A TiN layer has a barrier function to prevent metal ions from being diffused. Also, if a Cu layer is located on the surface of a seed layer, it is preferable for forming electrolytic copper-plated film in an opening portion. In addition, by forming a Ti layer between a TiN layer and a Cu layer, adhesiveness may be enhanced between the TiN layer and the Cu layer.

The second insulation layer may contain inorganic filler with an average particle diameter of 1.0 μm or smaller. If the second insulation layer contains inorganic filler, the thermal expansion coefficient may be lowered. Thus, expansion or shrinkage caused by thermal stresses will seldom occur in the insulation layer. In addition, if an average particle diameter of inorganic filler is 1.0 μm or smaller, after an opening for a via conductor is formed and a desmearing treatment is conducted, and even if such inorganic filler is exposed through the inner-wall surface of the opening portion, areas where inorganic filler is exposed will seldom hinder the forming of a seed layer. Accordingly, a seed layer may be formed uniformly on the inner-wall surface of the opening portion.

The thickness of the seed layer may be between 100-200 nm. If the thickness of a seed layer is between 100-200 nm, the function to prevent diffusion of copper ions may be even more effective, and time for quick etching may be shortened.

A metal layer containing Sn may be further formed on an area of the surface of the first conductive circuit which makes contact with the second insulation layer, and a coating made of a coupling agent is further formed on the metal layer. By forming a metal layer containing Sn on the surface of a first conductive circuit and by forming a coating made of a coupling agent on the metal film, adhesiveness may be enhanced between the first conductive circuit and the second insulation layer.

A printed wiring board may further include a resin layer formed on the second insulation layer and the second conductive circuit. Moreover, in an area of the surface of the second conductive circuit which is in contact with the resin layer, a metal layer containing Sn is further formed, and a coating made of a coupling agent is further formed on the metal layer. With such a structure, adhesiveness may be enhanced between the second conductive circuit and the resin layer formed thereon.

A method for manufacturing a printed wiring board according to another embodiment of the present invention includes the following: a step to form a first insulation layer; a step to form a first conductive circuit on the first insulation layer; a step to form a second insulation layer on the first insulation layer and the first conductive circuit; in the second insulation layer, a step to form an opening portion that reaches the first conductive circuit; on the inner-wall surface of the opening portion and on the surface of the conductive circuit exposed through the opening portion, a step to form a seed layer including at least one kind of a nitride compound or a carbide compound containing Ti, Zr, Hf, V, Nb, Ta or Si; by removing at least part of the seed layer formed on the surface of the first conductive circuit, a step to expose the surface of the first conductive circuit; and by performing plating on the seed layer and on the exposed surface of the first conductive circuit, a step to form in the opening portion a plated-metal film which makes contact with at least a section of the first conductive circuit.

In the method for manufacturing a printed wiring board, at least part of the seed layer formed on the surface of a first conductive circuit is removed to expose the surface of the first conductive circuit. Then, plating is performed on the exposed surface of the first conductive circuit, and a plated-metal film is formed which makes direct contact with the first conductive circuit at least in one section. By doing so, a printed wiring board may be manufactured to have a structure where a plated-metal film which forms a via conductor makes direct contact with a first conductive circuit at least in one section.

Thus, a printed wiring board may be obtained where electrical resistance is low between a via conductor and a first conductive circuit.

In the method for manufacturing a printed wiring board, a resist mask may be formed so as to expose at least one section of the seed layer, and the exposed seed layer is removed. By forming a resist mask which exposes one section of the seed layer, the exposed seed layer may be removed by a method such as etching.

In the method for manufacturing a printed wiring board, the seed layer may be formed by sputtering. When forming a seed layer by sputtering, a thin film may be formed without roughening the insulation layer, and thus variations in the thickness of the thin film may be reduced.

In the method for manufacturing a printed wiring board, a seed layer made up of a TiN layer, a Ti layer formed on the TiN layer, and a Cu layer formed on the Ti layer may be formed on the inner-wall surface of the opening portion. According to such a method, a TiN layer with a barrier function is arranged on areas in contact with the second insulation layer, and a Cu layer suitable for forming a plated-metal film may be arranged on the surface of the seed layer. In addition, by arranging a Ti layer between a TiN layer and a Cu layer, adhesiveness may be enhanced between the TiN layer and the Cu layer.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board comprising:
- a first insulation layer;
- a first conductive circuit formed on the first insulation layer;
- a second insulation layer formed on the first insulation layer and the first conductive circuit and having an opening portion reaching the first conductive circuit;
- a second conductive circuit formed on the second insulation layer; and
- a via conductor formed in the opening portion and connecting the first conductive circuit and the second conductive circuit,
- wherein the via conductor is formed on an inner-wall surface of the opening portion and has a seed layer comprising a TiN layer formed on the inner-wall surface of the opening portion, a Ti layer formed on the TiN layer and a Cu layer formed on the Ti layer and a plated-metal film formed in the opening portion, and the plated-metal film and the first conductive circuit have at least portions making direct contact.

2. The printed wiring board according to claim 1, wherein the plated-metal film is made of copper.

3. The printed wiring board according to claim 1, wherein the plated-metal film is filling the opening portion.

4. The printed wiring board according to claim 1, wherein the first conductive circuit has a first-surface portion directly in contact with the plated-metal film, and a second-surface portion directly in contact with the seed layer.

5. The printed wiring board according to claim 1, wherein the seed layer is formed by sputtering.

6. The printed wiring board according to claim 1, wherein the second insulation layer contains inorganic filler with an average particle diameter of 1.0 μm or smaller.

7. The printed wiring board according to claim 1, wherein the seed layer has a thickness which is set between 100-200 nm.

8. The printed wiring board according to claim 1, further comprising a metal layer containing Sn formed on an area of a surface of the first conductive circuit which makes contact with the second insulation layer, and a coating made of a coupling agent formed on the metal layer.

9. The printed wiring board according to claim 1, further comprising a resin layer formed on the second insulation layer and the second conductive circuit, wherein a metal layer containing Sn is further formed on an area of the surface of the second conductive circuit which makes contact with the resin layer, and a coating made of a coupling agent is further formed on the metal layer.

10. A printed wiring board comprising:
- a first insulation layer;
- a first conductive circuit formed on the first insulation layer;
- a second insulation layer formed on the first insulation layer and the first conductive circuit and having an opening portion reaching the first conductive circuit;
- a second conductive circuit formed on the second insulation layer; and
- a via conductor formed in the opening portion and connecting the first conductive circuit and the second conductive circuit,
- wherein the via conductor is formed on an inner-wall surface of the opening portion and has a seed layer including at least one of a nitride compound and a carbide compound containing Ti, Zr, Hf, V, Nb, Ta or Si and a plated-metal film formed in the opening portion, the plated-metal film and the first conductive circuit have at least portions making direct contact, and the second insulation layer contains inorganic filler with an average particle diameter of 1.0 μm or smaller.

11. The printed wiring board according to claim 10, wherein the plated-metal film is made of copper.

12. The printed wiring board according to claim 10, wherein the plated metal film is filling the opening portion.

13. The printed wiring board according to claim 10, wherein the first conductive circuit has a first-surface portion directly in contact with the plated-metal film, and a second-surface portion directly in contact with the seed layer.

14. The printed wiring board according to claim 10, wherein the seed layer is formed by sputtering.

15. The printed wiring board according to claim 10, wherein the seed layer has a thickness which is set between 100-200 nm.

16. The printed wiring board according to claim 10, further comprising a metal layer containing Sn formed on an area of a surface of the first conductive circuit which makes contact with the second insulation layer, and a coating made of a coupling agent formed on the metal layer.

17. The printed wiring board according to claim 10, further comprising a resin layer formed on the second insulation layer and the second conductive circuit, wherein a metal layer containing Sn is further formed on an area of the surface of the second conductive circuit which makes contact with the resin layer, and a coating made of a coupling agent is further formed on the metal layer.

18. A printed wiring board comprising:
- a first insulation layer;
- a first conductive circuit formed on the first insulation layer;
- a second insulation layer formed on the first insulation layer and the first conductive circuit and having an opening portion reaching the first conductive circuit;
- a second conductive circuit formed on the second insulation layer;

a via conductor formed in the opening portion and connecting the first conductive circuit and the second conductive circuit;

a metal layer containing Sn formed on an area of a surface of the first conductive circuit which makes contact with the second insulation layer; and a coating made of a coupling agent formed on the metal layer, wherein the via conductor is formed on an inner-wall surface of the opening portion and has a seed layer including at least one of a nitride compound and a carbide compound containing Ti, Zr, Hf, V, Nb, Ta or Si and a plated-metal film formed in the opening portion, and the plated-metal film and the first conductive circuit have at least portions making direct contact.

19. The printed wiring board according to claim 18, wherein the plated-metal film is made of copper.

20. The printed wiring board according to claim 18, wherein the plated-metal film is filling the opening portion.

21. The printed wiring board according to claim 18, wherein the first conductive circuit has a first-surface portion directly in contact with the plated-metal film, and a second-surface portion directly in contact with the seed layer.

22. The printed wiring board according to claim 18, wherein the seed layer is formed by sputtering.

23. The printed wiring board according to claim 18, wherein the seed layer has a thickness which is set between 100-200 nm.

24. A printed wiring board comprising:

a first insulation layer;

a first conductive circuit formed on the first insulation layer;

a second insulation layer formed on the first insulation layer and the first conductive circuit and having an opening portion reaching the first conductive circuit;

a second conductive circuit formed on the second insulation layer;

a via conductor formed in the opening portion and connecting the first conductive circuit and the second conductive circuit;

a resin layer formed on the second insulation layer and the second conductive circuit;

a metal layer containing Sn and formed on an area of the surface of the second conductive circuit which makes contact with the resin layer; and a coating made of a coupling agent formed on the metal layer, wherein the via conductor is formed on an inner-wall surface of the opening portion and has a seed layer including at least one of a nitride compound and a carbide compound containing Ti, Zr, Hf, V, Nb, Ta or Si and a plated-metal film formed in the opening portion, and the plated-metal film and the first conductive circuit have at least portions making direct contact.

25. The printed wiring board according to claim 24, wherein the plated-metal film is made of copper.

26. The printed wiring board according to claim 24, wherein the plated-metal film is filling the opening portion.

27. The printed wiring board according to claim 24, wherein the first conductive circuit has a first-surface portion directly in contact with the plated-metal film, and a second-surface portion directly in contact with the seed layer.

28. The printed wiring board according to claim 24, wherein the seed layer is formed by sputtering.

29. The printed wiring board according to claim 24, wherein the seed layer has a thickness which is set between 100-200 nm.

* * * * *